US010664631B1

(12) United States Patent
Bora

(10) Patent No.: US 10,664,631 B1
(45) Date of Patent: May 26, 2020

(54) SYSTEMS AND METHODS FOR NETWORK OPTIMIZATION IN A DISTRIBUTED BIG DATA ENVIRONMENT

(71) Applicant: PROS, Inc., Houston, TX (US)

(72) Inventor: Abhijit Bora, Sugarland, TX (US)

(73) Assignee: PROS, INC., Houston, TX (US)

( * ) Notice: Subject to any disclaimer, the term of this patent is extended or adjusted under 35 U.S.C. 154(b) by 764 days.

(21) Appl. No.: 14/164,688

(22) Filed: Jan. 27, 2014

(51) Int. Cl.
*G06F 30/20* (2020.01)

(52) U.S. Cl.
CPC .................. *G06F 30/20* (2020.01)

(58) Field of Classification Search
None
See application file for complete search history.

(56) References Cited

U.S. PATENT DOCUMENTS

| 8,055,521 B2 * | 11/2011 | Chacon | G06Q 10/00 703/2 |
| 2005/0137959 A1 * | 6/2005 | Yan | G06Q 20/102 705/37 |

OTHER PUBLICATIONS

Zhu, Kaihua, et al. "Parallelizing support vector machines on distributed computers." Advances in Neural Information Processing Systems. 2008.*
Rios, Joseph L., and Kevin Ross. "Massively Parallel Dantzig-Wolfe Decomposition Applied to Traffic Flow Scheduling." JACIC 7.1 (2010): 32-45. (Year: 2010).*
Ho, James K., and Etienne Loute. "An advanced implementation of the Dantzig—Wolfe decomposition algorithm for linear programming." Mathematical Programming 20.1 (1981): 303-326. (Year: 1981).*
"CPLEX LP file format", Sourceforge, LPSolve, Nov. 12, 2013, retrieved via the web archive from http://lpsolve.sourceforge.net/5.0/CPLEX-format.htm (Year: 2013).*

* cited by examiner

*Primary Examiner* — Bijan Mapar
(74) *Attorney, Agent, or Firm* — Womble Bond Dickinson (US) LLP; Daniel E. Ovanezian

(57) ABSTRACT

Systems and methods for network optimization in a distributed big data environment are provided. According to an aspect of the invention, a processor performs an optimization method by dividing a data set into a plurality of partitions. For each of the partitions, the processor generates a mathematical representation of a model by associating input data with elements of the model, wherein the mathematical representation includes an objective and at least one constraint. The processor forms a master objective by combining the objectives for the partitions, and forms a set of master constraints by combining the constraints for the partitions. The processor then generates an optimized solution based on the master objective and the master constraints.

15 Claims, 7 Drawing Sheets

SYSTEMS AND METHODS FOR NETWORK OPTIMIZATION IN A DISTRIBUTED BIG DATA ENVIRONMENT

BACKGROUND OF THE INVENTION

The present invention relates to optimizing a network in a distributed big data environment. A network is defined as a distribution of resources across products. For example, the resources may be seats in an airplane cabin, and the products may be airline tickets on flights between various destinations. Similarly, the resources may be cabins within a cruise ship, and the products may be cruise tickets or packages between various destinations. However, the network is not limited to these examples, and may include any situation in which resources are distributed across products having some capacity.

Data describing the resources may be analyzed to determine the optimal distribution of the resources across products to be offered for sale to customers. However, the data often include too many items to be stored and/or analyzed together. For example, in the cruise industry, a product's dimensions may include 1 ship, 1 week, 6 destinations, 9 segments, 10 cabin categories, 2 package types, 12 markets, 3 fare types, 7 price tiers, 3 occupancy types, and 45 weeks, such that the product includes 36,741,600 items. Further, the distribution may be subject to various constraints, such as price rationality rules, scheduling priorities, etc., which complicate the analysis. Accordingly, it would be advantageous to provide a method of handling the very large and complex data analysis that is required to determine the optimal distribution of resources across products.

SUMMARY OF THE INVENTION

Exemplary embodiments of the invention provide systems and methods for network optimization in a distributed big data environment. According to an aspect of the invention, a processor performs an optimization method by dividing a data set into a plurality of partitions. For each of the partitions, the processor generates a mathematical representation of a model by associating input data with elements of the model, wherein the mathematical representation includes an objective and at least one constraint. The processor forms a master objective by combining the objectives for the partitions, and forms a set of master constraints by combining the constraints for the partitions. The processor then generates an optimized solution based on the master objective and the master constraints.

The data set may be divided into the partitions on a market-by-market basis. Each of the partitions may be unique.

The master objective and the master constraints may be formed by incrementally aggregating the objectives and the constraints for the partitions. The master constraints may be formed by aggregating constraints with the same name. Each of the mathematical representations may include a plurality of constraints that together form a matrix.

The optimized solution may be generated by linear programming. To generate the optimized solution, the processor may determine whether a solution exists based on the master objective and the master constraints. If the solution does not exist, the processor may define slacks that relax the master constraints, and generate the optimized solution based on the master objective and the master constraints as relaxed by the slacks. The processor may generate the optimized solution by minimizing or maximizing the master objective while minimizing a sum of the slacks.

The optimized solution may maximize or minimize a target metric that is defined by the model. For example, the optimized solution may maximize revenue. The optimized solution may indicate a value for each of a plurality of decision variables defined by the model. Each of the decision variables may indicate a number of units of a product to sell.

According to another aspect of the invention, an optimization system is provided. The optimization system includes a memory and a processor coupled to the memory. The processor includes data partitioning logic that divides a data set into a plurality of partitions; mathematical representation generation logic that generates, for each of the partitions, a mathematical representation of a model by associating input data with elements of the model, wherein the mathematical representation includes an objective and at least one constraint; combination logic that forms a master objective by combining the objectives for the partitions, and that forms a set of master constraints by combining the constraints for the partitions; and solution logic that generates an optimized solution based on the master objective and the master constraints.

According to yet another aspect of the invention, a non-transitory computer-readable medium including computer instructions executable by a processor to cause the processor to perform the optimization method discussed above is provided.

Other objects, advantages, and novel features of the present invention will become apparent from the following detailed description of the invention when considered in conjunction with the accompanying drawings.

DETAILED DESCRIPTION OF EXEMPLARY EMBODIMENTS

Figure 1:
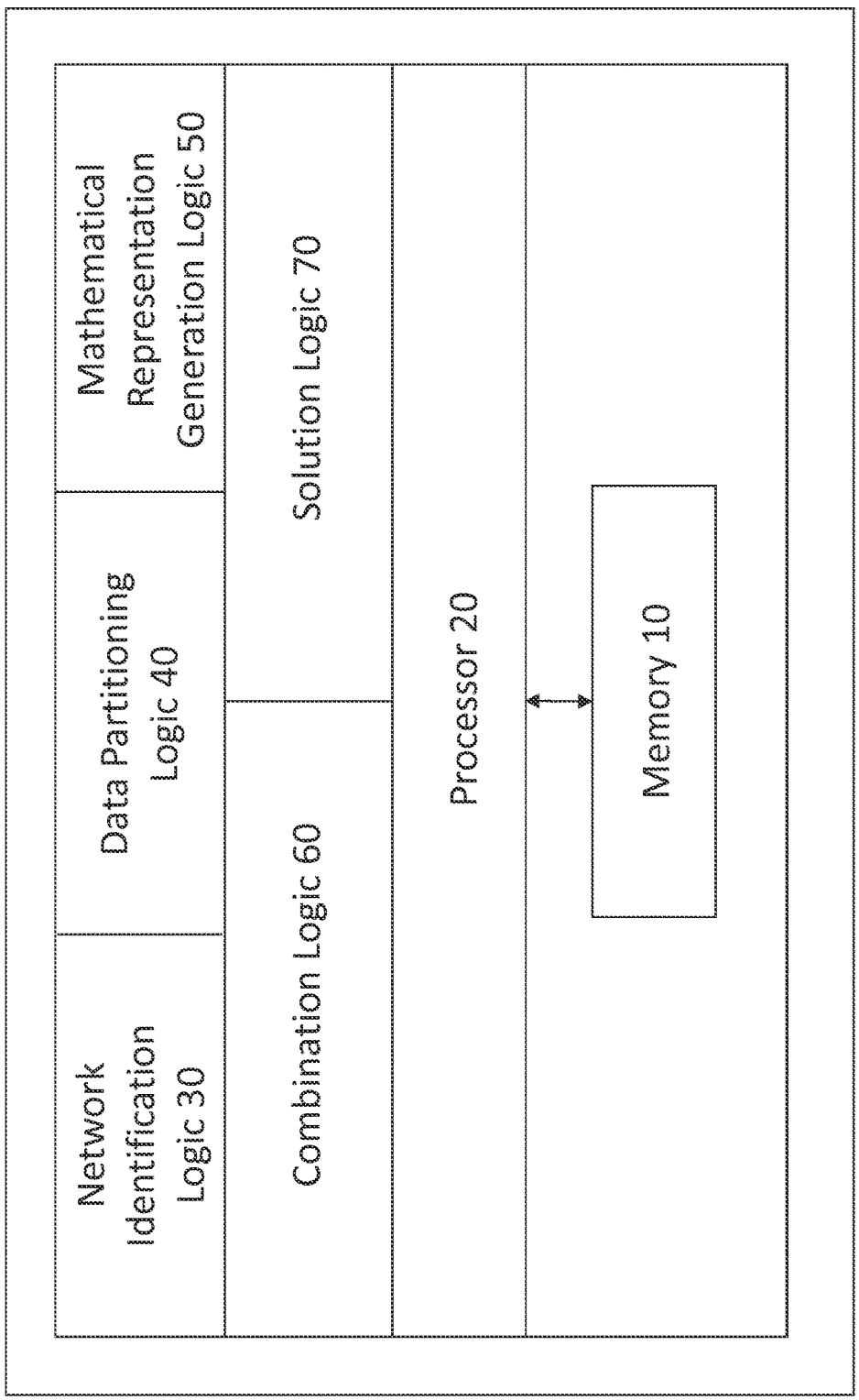
FIG. 1 shows a block diagram of an exemplary embodiment of a system for optimizing a network in a distributed big data environment.

FIG. 1 shows a block diagram of an exemplary embodiment of a system for optimizing a network in a distributed big data environment. As shown in FIG. 1, the system includes a memory 10 and a processor 20 coupled to the memory 10. The processor 20 includes logic 30-70, which will be described in more detail below in connection with FIGS. 2-7. The processor 20 can be any type of processor, such as a microprocessor, a field programmable gate array (FPGA), and/or an application specific integrated circuit (ASIC). When the processor 20 is a microprocessor, logic 30-70 can be processor-executable code that is loaded from the memory 10.

Figure 2:
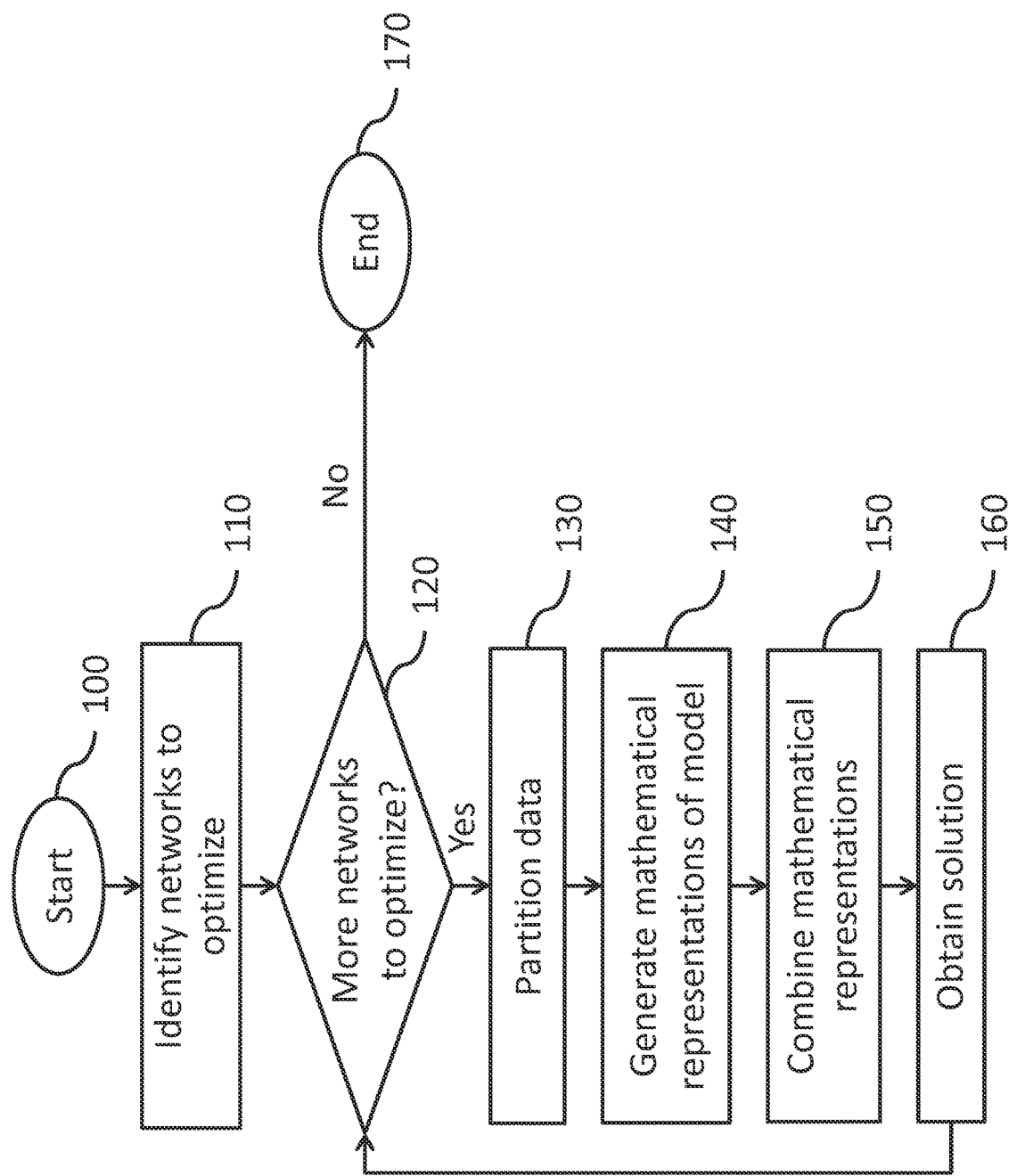
FIG. 2 shows a flowchart of an exemplary embodiment of a method for optimizing a network in a distributed big data environment.
Figure 3:
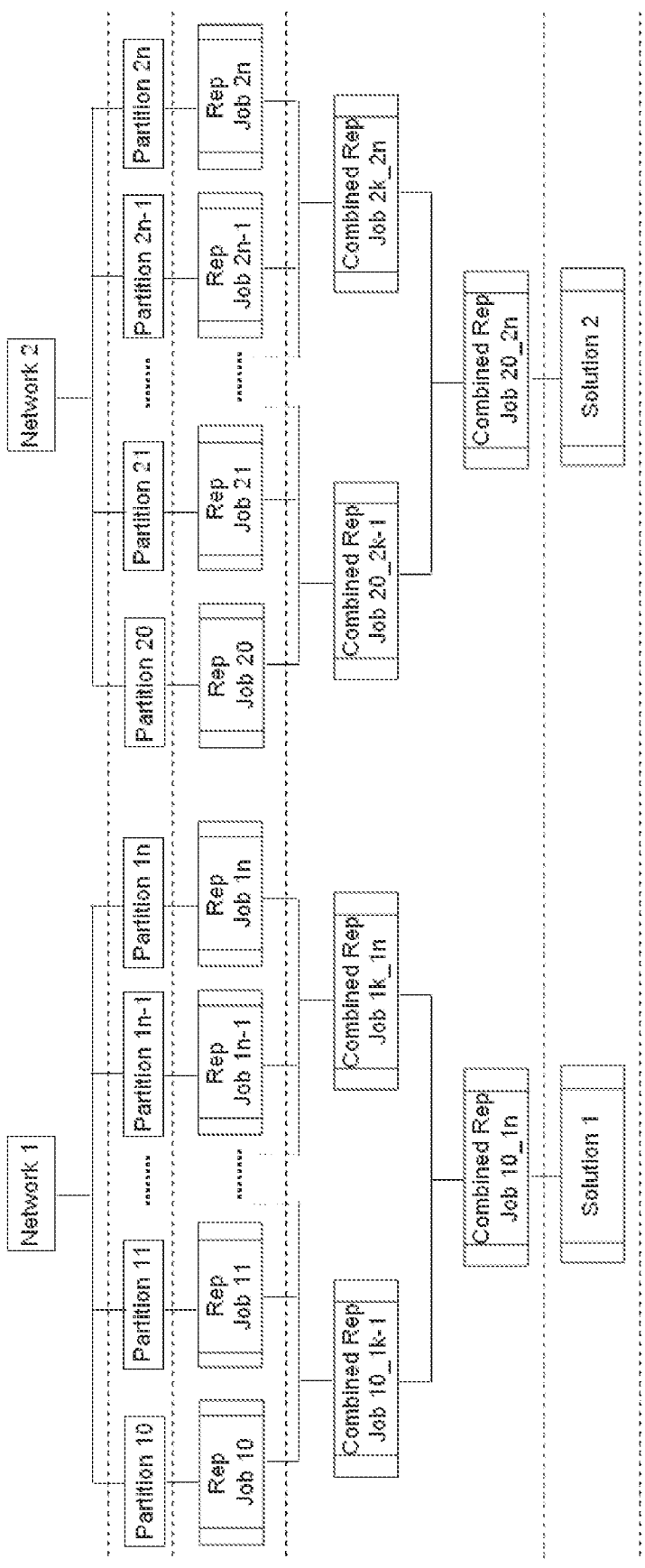
FIG. 3 shows how data are processed according to an exemplary embodiment of the invention.

FIGS. 2-7 show flowcharts of an exemplary embodiment of a method for optimizing a network in a distributed big data environment. FIG. 2 shows the overall workflow, and FIG. 3 shows how the data are handled in each step of the workflow. As shown in FIG. 2, the method begins at step 100. The network identification logic 30 identifies at least one network to optimize at step 110. As discussed above, a network is defined as a distribution of resources across products. For example, the resources may be seats in an airplane cabin, and the products may be airline tickets on flights between various destinations. A data set may be divided into a plurality of networks, or may be treated as a single network. FIG. 3 shows an example in which two networks (Network 1 and Network 2) are identified.

Figure 4:
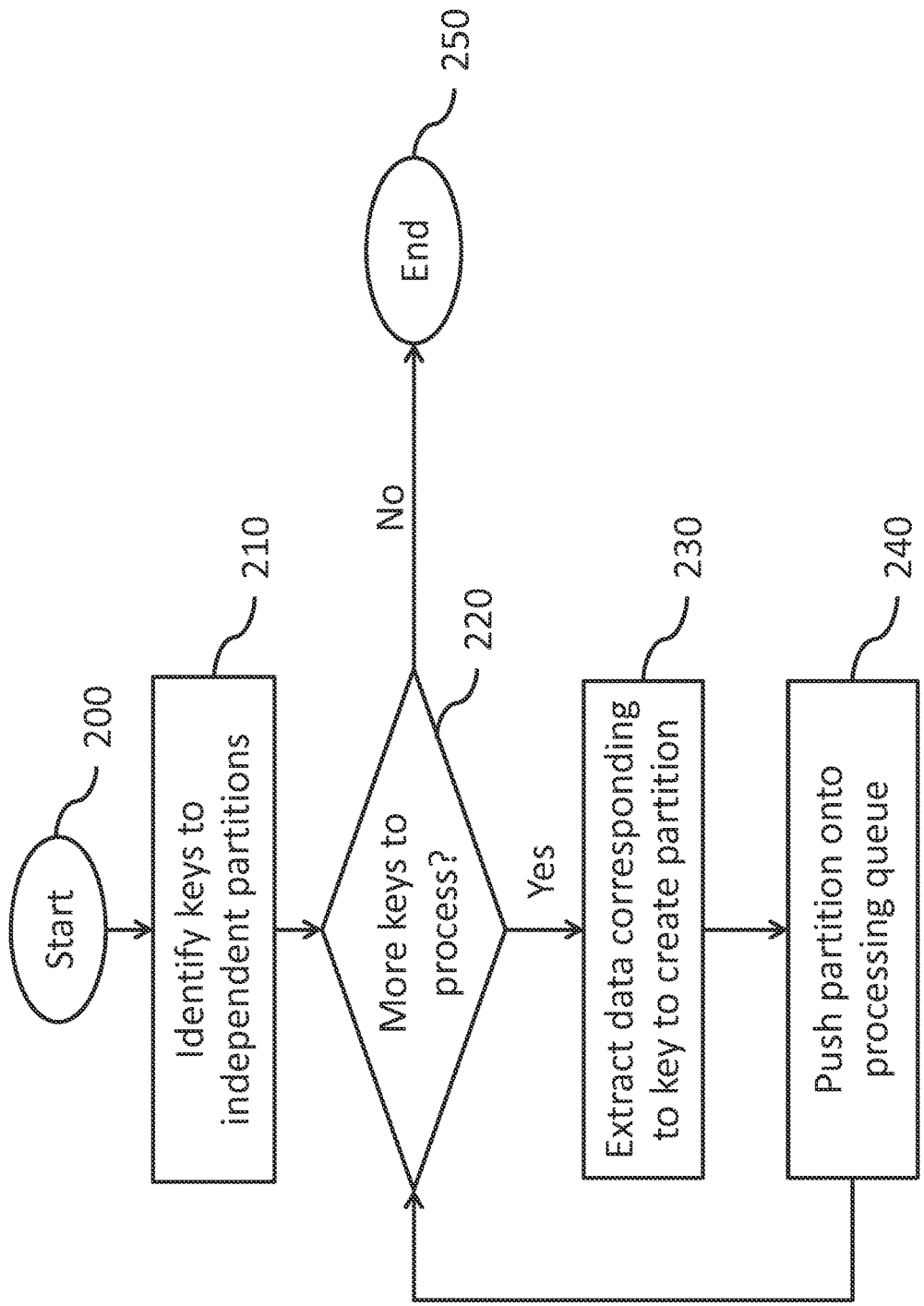
FIG. 4 shows a method for partitioning the data according to an exemplary embodiment of the invention.

As shown in FIG. 2, the network identification logic 30 determines whether there are more networks to optimize at step 120. If there are more networks to optimize, the data partitioning logic 40 divides the data set for one of the remaining networks into partitions at step 130. FIG. 4 shows a method for partitioning the data according to an exemplary embodiment of the invention. As shown in FIG. 4, the method begins at step 200. The data partitioning logic 40 identifies keys to independent partitions at step 210. As a very simple example, if the data are partitioned according to market type, the data partitioning logic 40 may identify "L" for large markets, "M" for medium markets, and "S" for small markets as the keys. The keys may also be a combination of attributes, such as market type and geography. For example, if there are three market types and three geographical regions, the data partitioning logic 40 would identify nine keys, each of which is a combination of one market type and one geographical region.

The data partitioning logic 40 then determines whether there are more keys to process at step 220. If there are more keys to process, the data partitioning logic 40 extracts the data corresponding to one of the remaining keys in order to create a partition at step 230. For example, the data partitioning logic 40 queries the database for the network to identify and extract all entries that correspond to the key. One partition is created for each key. Next the data partitioning logic 40 pushes the partition onto the processing queue at step 240, and continues inquiring whether there are more keys to process at step 220 until all of the keys have been processed. Once all of the keys have been processed and the corresponding partitions have been created, the method ends at step 250. An example of the partitions is shown in FIG. 3, where Partitions 10 through 1*n* are created for Network 1 and Partitions 20 through 2*n* are created for Network 2. Within a network, each of the partitions is unique, such that the partitions are independent and have non-overlapping constraints.

Figure 5:
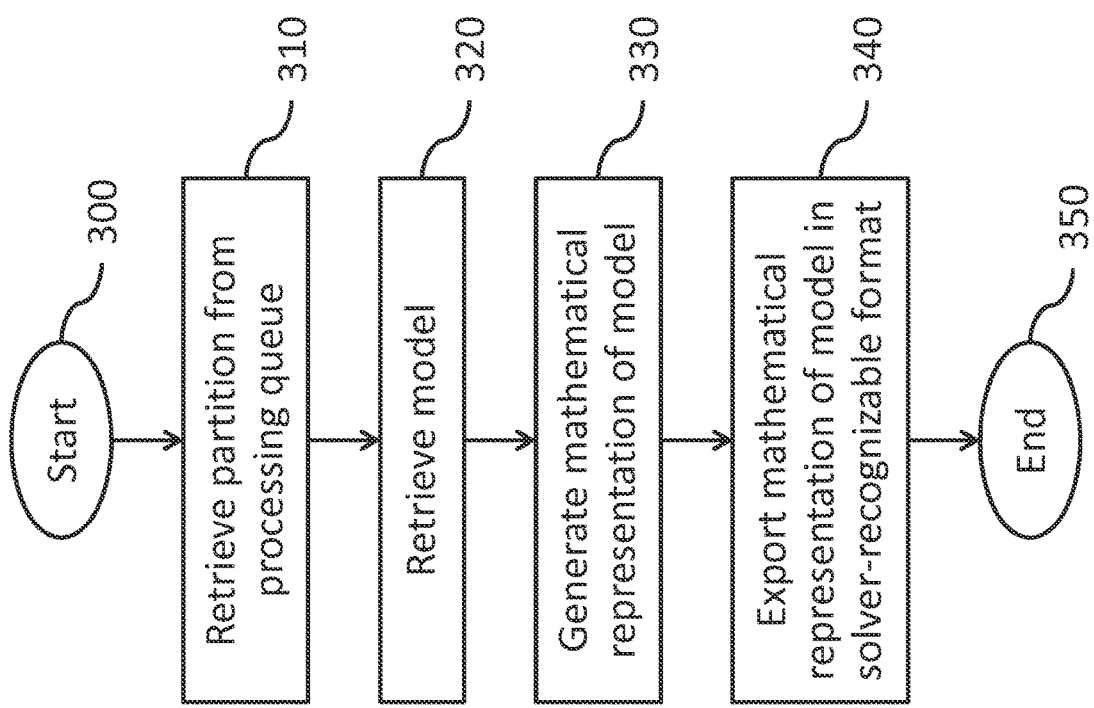
FIG. 5 shows a method for generating the mathematical representation of the model for one of the partitions according to an exemplary embodiment of the invention.

Returning to FIG. 2, the mathematical representation generation logic 50 generates a mathematical representation of a model for each partition at step 140. FIG. 5 shows a method for generating the mathematical representation of the model for one of the partitions according to an exemplary embodiment of the invention. As shown in FIG. 5, the method begins at step 300. The mathematical representation generation logic 50 retrieves a partition from the processing queue at step 310. The mathematical representation generation logic 50 then retrieves a model for the network at step 320. The model is a high-level expression of a mathematical problem, and includes definitions of the resources and products in the network, along with decision variables, an objective, and a set of constraints. An example of a model for an airplane cabin is shown in Table 1. In this example, the objective is to maximize the total revenue, subject to a capacity constraint and an upper bound constraint.

Table 1

```
/*********************************************
Optimization Model for optimal allocation of Demand for
Products, given some finite Resource Capacity from which
that Demand has to be met.
Also, Products will have a forecasted upper bound on the
Demand that can be consumed.
*********************************************/
//--- The entities involved in Optimization
/ represents a compartment in an Airline
tuple Resource
{
   int resId;
   string carrierCode;
   int flightNumber;
   string flightDate;
   string origin;
   string destination;
   string compartmentCode;
}
// represents remaining capacity in the Resource
tuple AvailableCapacity
{
   key int resId;
   int capacity;
}
// represents a booking entity—against which optimal
demand allocation has to be computed—
// that optimal demand cannot be more than the forecasted
demand (fcstDemand), and also
// cannot go beyond the capacity provided by the associated
Resource
tuple Product
{
   key int prodId;
   Resource resource;
   string classCode;
   string pointOfSale;
   string flightSequence;
   int fcstDemand;
   float fare;
}
// the set of all Products for a given Optimization chunk
(Product) products= . . . ;
// the set of associated Resources for those Products
{Resource} resources={p.resource|p in products};
{int} resIds={r.resId|r in resources};
// the set of available capacities
{AvailableCapacity} capacities= . . . ;
AvailableCapacity capsIndex[resIds]=[c.resId:c|c in capacities];
//--- The Decision Variables
// let "x" represent the desired optimal allocation
dvar float+x[products];
//--- The Objective—maximize total revenue
// [Multiply allocation with the fare to get the revenue]
maximize
   sum(p in products)
   p.fare*x[p];
//--- The Constraints
``` subject to
{
  // Capacity constraint
  // [for a given Resource, locate all associated Products and sum their allocation, to not exceed capacity]
    forall(resId in resIds)
    CapacityConstraint:
    sum (p in products: p.resource.resId in {resId})
    x[p]<=capsIndex[resId].capacity;
  // Upper Bound constraint
  // [for each Product, limit allocation by its forecasted demand]
    forall(p in products)
    UpperBoundConstraint:
    x[p]<=p.fcstDemand;
}

Next the mathematical representation generation logic 50 generates a mathematical representation of the model for the partition by associating input data with elements of the model. The input data include attributes for the products and capacity values for the resources associated with the products. An example of the input data for the airplane cabin is shown in Table 2.

Table 2

```
/************************************************
************
Representative Data for the Optimization Model—will specify:
1. The set of Products
2. Capacity values for Resources associated with the Products
************************************************
************/
/*
Represents rows of data filling in the following attributes for each Product -->
prodId resId carrierCode flightNumber flightDate origin destination compartmentCode classCode pointOfSale flightSequence fcstDemand fare
*/
products={<1 1 AA 2663 "2-4-2013" MIA IAH compX clsCodeX Houston "MIA-SAT-IAH" 20 250>
  <2 1 AA 2663 "2-4-2013" MIA IAH compX clsCodeX Mumbai "MIA-SAT-IAH" 40 250>
  <3 2 AA 3663 "2-5-2013" MIA SEA compX clsCodeX Houston "MIA-LAX-SEA" 10 400>
  <4 2 AA 3663 "2-5-2013" MIA SEA compX clsCodeX Dubai "MIA-LAX-SEA" 30 400>};
/*
Represents rows of data filling in the following attributes for required Resources -->
carrierCode flightNumber flightDate origin destination compartmentCode capacity
*/
capacities=(<1 30>
  <2 25>);
```

The result of associating the input data with the elements of the model is a low-level expression of a mathematical problem of the form: Maximize f(X) subject to $A*X \leq B$. A, X, and B are matrices that may correspond to linear equations when multiplied out. The linear equations represent constraints. The A matrix includes the coefficient of the constraints, the X matrix includes the decision variables, and the B matrix includes the constants on the right-hand side of the linear equations. Table 3 shows an example of the mathematical representation obtained by associating the input data shown in Table 2 with the model shown in Table 1. The mathematical representation generation logic 50 exports this mathematical representation in a solver-recognizable format, such as a linear programming file (an "LP file"), in step 340. The method ends at step 350. The mathematical representation generation logic 50 performs the method shown in FIG. 5 for each partition. FIG. 3 shows that LP files Rep Job 10 through Rep Job 1n are generated for Network 1, and LP files Rep Job 20 through Rep Job 2n are generated for Network 2.

Table 3

```
\ENCODING=ISO-8859-1
\Problem name: Example problem
Maximize
  obj: 250 x({(})+250 x({2})+400 x({3})+400 x({4})
Subject To
  CapacityConstraint(1): x({1})+x({2})<=30
  CapacityConstraint(2): x((3))+x((4)<=25
  UpperBoundConstraint((1)): x({1})<=20
  UpperBoundConstraint({2}): x({2})<=40
  UpperBoundConstraint({3}): x({3})<=10
  UpperBoundConstraint({4}): x({4})<=30
```

Figure 6:
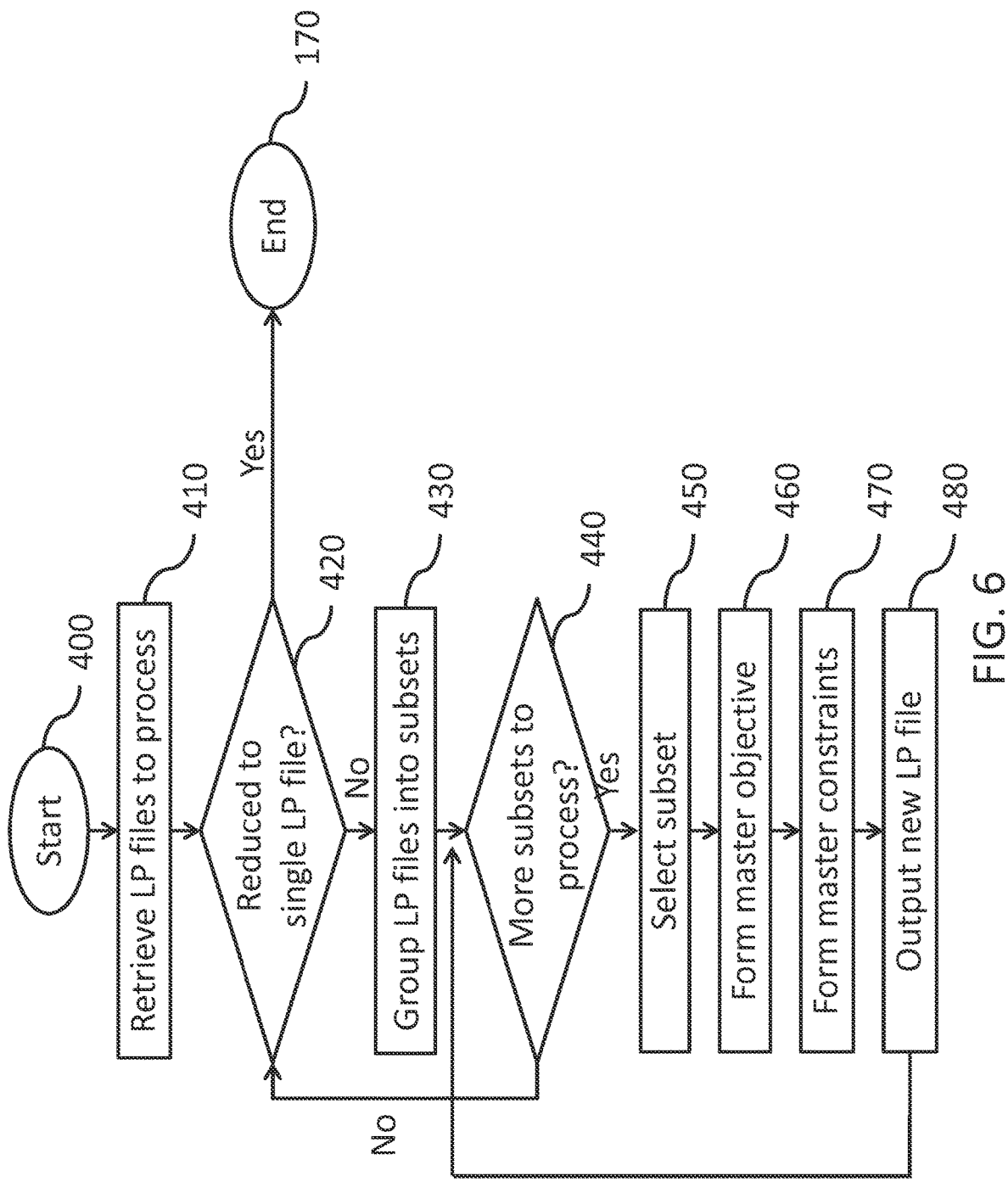
FIG. 6 shows a method for combining the mathematical representations according to an exemplary embodiment of the invention.

Returning to FIG. 2, the combination logic 60 combines the mathematical representations for the partitions at step 150. FIG. 6 shows a method for combining the mathematical representations according to an exemplary embodiment of the invention. As shown in FIG. 6, the method begins at step 400. The combination logic 60 retrieves the LP files generated by the mathematical representation generation logic 50 for one of the networks at step 410. The combination logic 60 then determines whether the LP files have been reduced to a single LP file at step 420. If more than one LP file remains, the combination logic 60 groups the remaining LP files into subsets at step 430. For example, the remaining LP files may be divided into groups of two, three, or any other appropriate number. The combination logic 60 then determines whether there are any remaining subsets to process at step 440. If not all of the subsets have been processed, the combination logic 60 selects one of the subsets at step 450.

As discussed above, each mathematical representation includes an objective and at least one constraint. The combination logic 60 forms a master objective by combining the objectives for the partitions within the selected subset at step 460. Further, the combination logic 60 forms a set of master constraints by combining the constraints for the partitions within the selected subset at step 470. The result is a reduced LP file that includes only the master objective and the set of master constraints. Table 4 shows a very simple example of a reduced LP file that is obtained by combining a first LP file and a second LP file. As shown in Table 4, the master objective may be obtained by simply combining the individual objectives. Further, the set of master constraints may be obtained by combining constraints with the same name to form new constraints, and including the other constraints with unique names within the set of master constraints. The combination logic 60 then outputs the reduced LP file at step 480.

Table 4

First LP File
  Maximize x+y, subject to constraints {C1, C1_x_y, C1_x}
  C1:x+y>=100
  C1_x_y: x>=y+10
  C1_x:x<=5

Second LP File
  Maximize x2+y2, subject to constraints (C1, C1_x2_y2, C1_x2)
    C1: x2+y2>=100
    C1_x2_y2: x2>=y2+10
    C1 x2:x2<=5
Reduced LP File
  Maximize x+y+x2+y2, subject to
    C1:x+y+x2+y2>=100
    C1_x_y: x>=y+10
    C1_x: x<=5
    C1_x2_y2: x2>y2+10
    C1_x2:x2<=5

Next the combination logic 60 again determines whether there are any remaining subsets to process at step 440. If not all of the subsets have been processed, the combination logic 60 repeats steps 450-480 for another one of the subsets. In this manner all of the subsets within a network are processed to generate a reduced LP file for each of the subsets. FIG. 3 shows a very simplified example in which a subset including Rep Job 10 and Rep Job 1 is processed to generate Combined Rep Job 10_1$k$−1 and a subset including Rep Job 1$n$−1 and Rep Job 1$n$ is processed to generate Combined Rep Job 1$k$_1$n$ for Network 1. This process is then repeated incrementally until only a single LP file remains, and ends at step 490. In the example shown in FIG. 3, the Combined Rep Job 10_1$n$ is a single LP file that has been reduced to a minimal representation of the problem.

Figure 7:
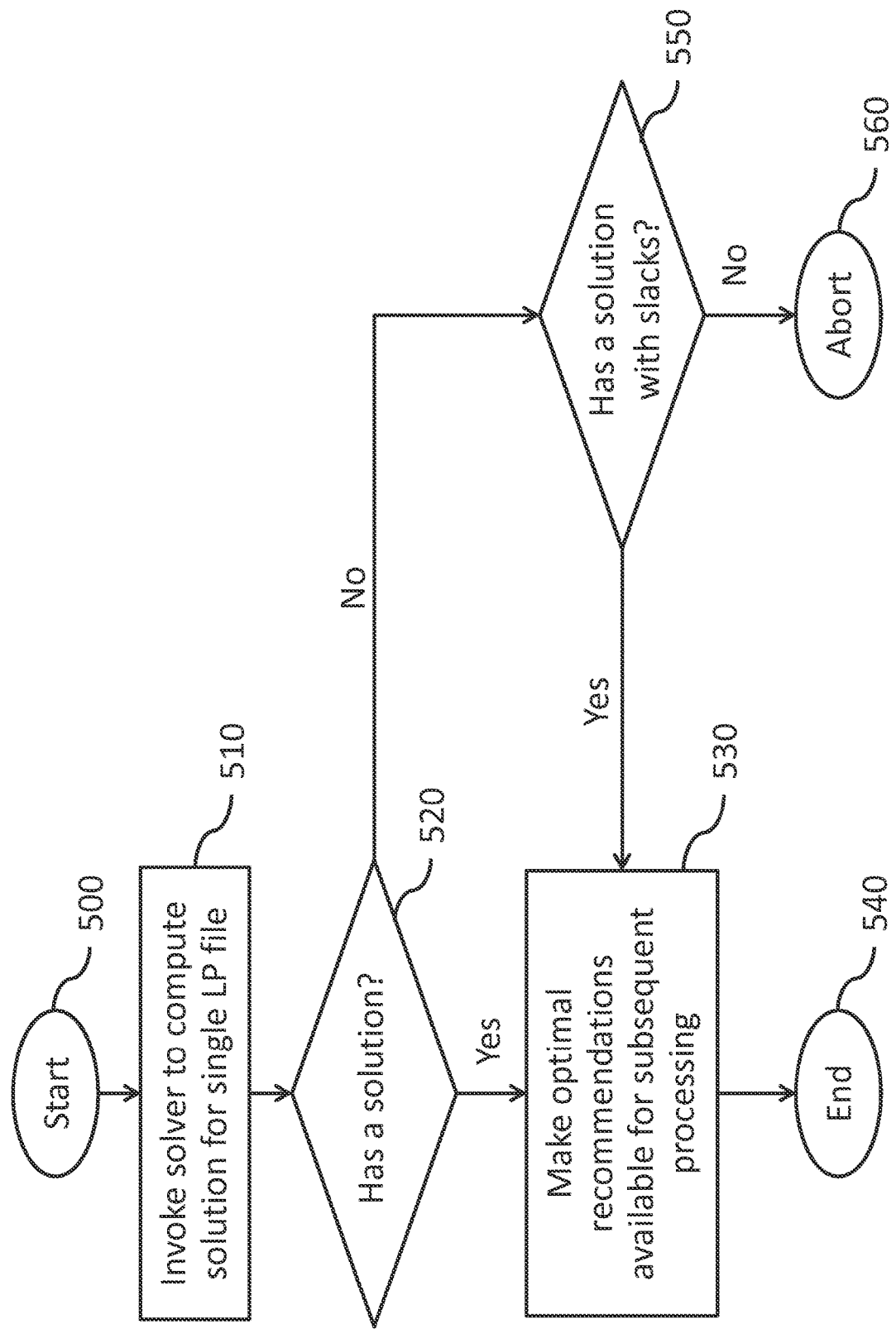
FIG. 7 shows a method for obtaining an optimized solution according to an exemplary embodiment of the invention.

Returning to FIG. 2, the solution logic 70 obtains an optimized solution to the problem based on the master objective and the master constraints in the single LP file in step 160. FIG. 7 shows a method for obtaining an optimized solution according to an exemplary embodiment of the invention. As shown in FIG. 7, the method begins at step 500. The solution logic 70 invokes a solver to calculate a solution for the problem expressed in the single LP file at step 510. The problem may be a linear problem, a quadratic problem, or any other suitable form. The solution logic 70 determines whether the problem has a solution at step 520. If there is a solution, the solution logic 70 outputs the solution in order to make the optimal recommendations available for further processing at step 530, and the process ends at step 540.

If the solution logic 70 determines that there is no solution at step 520, the solution logic 70 determines whether there would be a solution if slacks were applied at step 550. As a very simple example, a problem in which x is maximized subject to the constraints that $x \leq 5$ and $x \geq 6$ has no solution, because it is impossible to satisfy both constraints simultaneously. However, this problem can be rewritten as two problems using the slack variables s0 and s1, as shown in Table 5. The solution logic 70 solves these two problems by maximizing the objective while minimizing the sum of the slacks. In this example the solution is s0=1 and s1=0, which implies that x=6.

Table 5

Problem 1
  Minimize z
    x−s0<=5
    x+s1>=6
    z=s0+s1
  Bounds:
    0<=s0<=Infinity
    0<=s1<=Infinity Problem 2
  Maximize x
    x−s0<=5
    x+s1>=6
    s0+s1=z
  Bounds:
    0<=s0<=Infinity
    0<=s1<=Infinity If the solution logic 70 determines that there is no solution with the slacks at step 550, the solution logic 70 aborts the process at step 560. However, if the solution logic 70 determines that there is a solution with the slacks at step 550, the solution logic 70 outputs the solution in order to make the optimal recommendations available for further processing at step 530, and the process ends at step 540. FIG. 3 shows that Solution 1 is output for Network 1, and that Solution 2 is output for Network 2.

The solution will include values for all of the decision variables in the single reduced LP file that is generated by the combination logic 60 at step 150. In the simple example shown in Table 3, the solution will include all of the components of x. Here x indicates the number of each of the products to be offered for sale. The solution may be further processed to determine the optimal price of each of the products.

Returning to FIG. 2, the network identification logic 30 again determines whether there are more networks to optimize at step 120. If there are more networks to optimize, the method proceeds again with steps 130-160. On the other hand, if all of the identified networks have been optimized, the method ends at step 170.

Exemplary embodiments of the invention provide a method of handling the very large and complex data analysis that is required to determine the optimal distribution of resources across products. The data sets are typically too large to fit within the memory of a program written to compute a solution. However, partitioning the data allows the method to generate mathematical representations of the model in manageable pieces. The pieces are then combined and reduced into the single LP file, which the solver uses to provide the optimal solution. Throughout the method, parallel processing may be used to increase efficiency.

The methods discussed above are executed by a computer processor that is programmed to perform the methods so that the processor executes the programming to perform the methods. Such a processor is needed to handle the large volumes of data and to perform the complex and computationally-intensive analysis of the methods discussed above. In addition, the processor is required to perform the methods in a commercially viable timeframe. Accordingly, it is necessary to quickly process large and complex data sets.

According to another exemplary embodiment of the invention, there is provided a non-transitory computer-readable medium encoded with a computer program for switching a mode of a vehicle. The term "computer-readable medium" as used herein refers to any medium that participates in providing instructions for execution. Common forms of computer-readable media include, for example, a floppy disk, a flexible disk, a hard disk, magnetic tape, any other magnetic medium, a CD-ROM, any other optical medium, punch cards, paper tape, any other physical medium with patterns of holes, a RAM, a PROM, an EPROM, a FLASH-EPROM, any other memory chip or cartridge, and any other non-transitory medium from which a computer can read.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A processor executable method of determining an optimized distribution of resources across products stored at a plurality of memories via a solution logic of the processor, the method comprising:
dividing, by data partitioning logic of the processor, a data set describing the resources at the plurality of memories into a plurality of partitions, wherein the data set is too large to fit within a local memory of the processor that is separate from the plurality of memories;
for each of the partitions of the plurality of memories, generating, by a mathematical representation generation logic of the processor, a linear programming file (LP file) that is a mathematical representation of a linear programming model by associating input data with elements of the model, wherein the mathematical representation includes an objective and at least one constraint;
generating, by a combination logic of the processor, a single master LP file to be stored in the local memory of the processor, wherein the single master LP file is a master mathematical representation of a master model, wherein the generating is via combining the LP files of each partition, the combining including:
forming a master objective by combining the objectives for the LP files; and
forming a set of master constraints by combining the constraints for the LP files;
storing the single master LP file in the local memory of the processor that is separate from the plurality of memories in place of the data set that is too large to fit within the local memory of the processor; and
generating, by the solution logic of the processor, an optimized solution to the single master LP file, stored in the local memory of the processor, based on the master objective and the master constraints, the optimized solution being a terminal solution for the optimized distribution of the resources described by the data set.

2. The method according to claim 1, wherein the data set is divided into the partitions on a market-by-market basis.

3. The method according to claim 1, wherein each of the partitions is unique.

4. The method according to claim 1, wherein the master objective and the master constraints are formed by incrementally aggregating the objectives and the constraints for the partitions.

5. The method according to claim 1, wherein the master constraints are formed by aggregating constraints with the same name.

6. The method according to claim 1, wherein each of the mathematical representations includes a plurality of constraints that together form a matrix.

7. The method according to claim 1, wherein the optimized solution is generated by linear programming.

8. The method according to claim 1, wherein generating the optimized solution comprises:
determining whether a solution exists based on the master objective and the master constraints; and
if the solution does not exist, defining slacks that relax the master constraints, and generating the optimized solution based on the master objective and the master constraints as relaxed by the slacks.

9. The method according to claim 8, wherein the optimized solution is generated by minimizing or maximizing the master objective while minimizing a sum of the slacks.

10. The method according to claim 1, wherein the optimized solution maximizes or minimizes a target metric that is defined by the model.

11. The method according to claim 10, wherein the optimized solution maximizes revenue.

12. The method according to claim 1, wherein the optimized solution indicates a value for each of a plurality of decision variables defined by the model.

13. The method according to claim 12, wherein each of the decision variables indicates a number of units of a product to sell.

14. An optimization system to optimize distribution of resources across products at a plurality of memories, the system comprising:
a local memory; and
a processor coupled to the memory, the processor comprising:
data partitioning logic that divides a data set describing the resources at the plurality of memories that are separate from the local memory into a plurality of partitions, wherein the data set is too large to fit within the local memory;
mathematical representation generation logic that generates, for each of the partitions of the plurality of memories, a linear programming file (LP file) that is a mathematical representation of a linear programming model by associating input data with elements of the model, wherein the mathematical representation includes an objective and at least one constraint;
combination logic that generates a single master LP file to be stored in the local memory, wherein the single master LP file is a master mathematical representation of a master model, wherein the generating is via combining the LP files of each partition, the combining including: forming a master objective by combining the objectives for the LP files, and that forms a set of master constraints by combining the constraints for the LP files; and
solution logic that generates an optimized solution to the single master LP file, stored in the local memory that is separate from the plurality of memories in place of the data set that is too large to fit within the local memory, based on the master objective and the master constraints, the optimized solution being a terminal solution for the optimized distribution of the resources described by the data set.

15. A non-transitory computer-readable medium comprising computer instructions executable by a processor to cause the processor to perform a method of determining an optimized distribution of resources across products at a plurality of memories via a program of the processor, the method comprising:
dividing a data set describing the resources at the plurality of memories into a plurality of partitions, wherein the data set is too large to fit within a local memory of the processor that is separate from the plurality of memories;
for each of the partitions of the plurality of memories, generating a linear programming file (LP file) that is a mathematical representation of a linear programming model by associating input data with elements of the model, wherein the mathematical representation includes an objective and at least one constraint;

generating, a single master LP file that is a master mathematical representation of a master model to be stored in the local memory of the processor, via combining the LP files of each partition, the combining including:
   forming a master objective by combining the objectives for the partitions; and
   forming a set of master constraints by combining the constraints for the partitions;
storing the single master LP file in the local memory of the processor that is separate from the plurality of memories in place of the data set that is too large to fit within the local memory of the processor; and
generating an optimized solution to the single master LP file stored in the local memory of the processor, via running the program thereon, based on the master objective and the master constraints, the optimized solution being a terminal solution for the optimized distribution of the resources described by the data set.

* * * * *